(12) United States Patent
Switzer

(10) Patent No.: US 10,980,130 B2
(45) Date of Patent: Apr. 13, 2021

(54) METAL FOILS WITH ORDERED CRYSTAL STRUCTURE AND METHOD FOR PRODUCING METAL FOILS

(71) Applicant: The Curators of the University of Missouri, Columbia, MO (US)

(72) Inventor: Jay A. Switzer, Rolla, MO (US)

(73) Assignee: THE CURATORS OF THE UNIVERSITY OF MISSOURI, Columbia, MO (US)

(*) Notice: Subject to any disclaimer, the term of this patent is extended or adjusted under 35 U.S.C. 154(b) by 191 days.

(21) Appl. No.: 16/178,201

(22) Filed: Nov. 1, 2018

(65) Prior Publication Data

US 2019/0132957 A1 May 2, 2019

Related U.S. Application Data

(60) Provisional application No. 62/580,090, filed on Nov. 1, 2017.

(51) Int. Cl.
| | |
|---|---|
| *B32B 38/10* | (2006.01) |
| *H05K 3/02* | (2006.01) |
| *B32B 7/06* | (2019.01) |
| *C23C 14/02* | (2006.01) |
| *H05K 3/06* | (2006.01) |
| *H01L 51/00* | (2006.01) |

(52) U.S. Cl.
CPC .............. *H05K 3/025* (2013.01); *B32B 7/06* (2013.01); *B32B 38/10* (2013.01); *C23C 14/025* (2013.01); *H01L 51/00* (2013.01); *H01L 51/0097* (2013.01); *H05K 3/062* (2013.01); *B32B 2457/08* (2013.01); *H05K 2201/0317* (2013.01); *H05K 2201/0355* (2013.01); *H05K 2203/0315* (2013.01)

(58) Field of Classification Search
CPC ......... B32B 7/06; B32B 38/10; C23C 14/025; H01L 51/00; H01L 51/0097; H05K 3/062; H05K 3/025
See application file for complete search history.

(56) References Cited

U.S. PATENT DOCUMENTS

| 5,891,285 A * | 4/1999 | Nakayama | ............. C25D 1/003 156/150 |
| 2005/0048306 A1* | 3/2005 | Suzuki | ..................... C25D 1/04 428/548 |
| 2016/0343568 A1* | 11/2016 | Dai | ..................... H01L 27/1296 |

FOREIGN PATENT DOCUMENTS

JP          51-050230 A  *  5/1976

OTHER PUBLICATIONS

Machine Translation of JP51-050230A (Year: 1976).*

* cited by examiner

*Primary Examiner* — Daniel McNally
(74) *Attorney, Agent, or Firm* — Stinson LLP

(57) ABSTRACT

A method for producing a metal foil comprising depositing metal onto an oxidizable substrate to form a metal film on the substrate; oxidizing the substrate at an interface between the metal film and the substrate; and removing the metal film from the substrate to yield a metal foil. A method for forming a thin metal film comprising pre-polarizing a single-crystal Si substrate by application of a potential which is negative of a potential at which Si oxidizes, which pre-polarization occurs in the presence of metal ions to form metal growth nucleation sites on the substrate, followed by application of a potential at which both oxidation of Si and electrodeposition of the metal occur to grow the metal film and oxidize the Si to SiOx, which potential is more positive than the potential applied in the pre-polarization step.

20 Claims, 7 Drawing Sheets

US 10,980,130 B2

METAL FOILS WITH ORDERED CRYSTAL STRUCTURE AND METHOD FOR PRODUCING METAL FOILS

REFERENCE TO RELATED APPLICATION

This application claims priority to U.S. provisional patent application 62/580,090 filed Nov. 1, 2017, the entire disclosure of which is expressly incorporated herein by reference.

STATEMENT OF GOVERNMENT INTEREST

This invention was made with Government support under U.S. Department of Energy contract DE-FG02-08ER46518. The Government may have certain rights in the invention.

FIELD OF THE INVENTION

This invention relates to thin metal-based foils such as foils based on gold, silver, and copper, and to a method for making such foils. Such foils can be useful, for example, in making electronics and especially flexible electronics. Such foils can also be useful, for example, in making jewelry.

BACKGROUND

Single-crystal silicon (Si) has been the foundation of semiconductor devices due to the high crystalline perfection that minimizes electron-hole recombination, and the dense SiOx native oxide that minimizes surface states. There is interest in moving beyond the rigid structure of conventional Si-based chips to produce flexible electronic devices such as wearable solar cells, sensors, and flexible displays. Flexible devices have been produced using ultrathin foils of Si. Conductive polymers, carbon nanotubes, graphene, and metal nanostructures have been used as transparent and flexible substrates for flexible electronics. Ultrathin (5-30 nm) metal films have relatively high optical transmittance, flexibility, improved device efficiency, and low sheet resistance. However, ultrathin metal films are usually are grown by vacuum evaporation or sputtering which gives a polycrystalline or textured deposit. Polycrystalline electronic materials suffer from electron-hole recombination at grain boundaries. In order to expand the palette of electronic materials beyond planar Si, an inexpensive source of highly-ordered material is needed that can serve as an inert substrate for the epitaxial growth of grain-boundary-free semiconductors, optical materials, and superconductors.

Thin metal foils have application in a wide variety of other products and devices beyond substrates for electronics.

SUMMARY OF THE INVENTION

Briefly, therefore, in one aspect the invention is directed to a method for producing a metal foil comprising depositing metal onto an oxidizable substrate to form a metal film on the substrate; oxidizing the substrate at an interface between the metal film and the substrate; and removing the metal film from the substrate to yield a metal foil.

The invention is also directed to a method for forming a thin metal film comprising pre-polarizing a single-crystal Si substrate by application of a potential which is negative of a potential at which Si oxidizes, which pre-polarization occurs in the presence of metal ions to form metal growth nucleation sites on the substrate, followed by application of a potential at which both oxidation of Si and electrodeposition of the metal occur to grow the metal film and oxidize the Si to SiOx, which potential is more positive than the potential applied in the pre-polarization step.

In another aspect, the invention is directed to a transparent metal foil having an ordered crystal structure and a thickness between about 5 and about 50 nm, as well as to a device incorporating such foil, such as a photovoltaic device, a high temperature superconductor device, a stress-free microelectromechanical system (MEMS) device, a catalyst, a self-assembled monolayer, a molecular electronic device, or a jewelry component.

Other objects and features of the invention will be in part apparent and in part pointed out hereinafter.

DETAILED DESCRIPTION OF PREFERRED EMBODIMENTS

Figure 1:
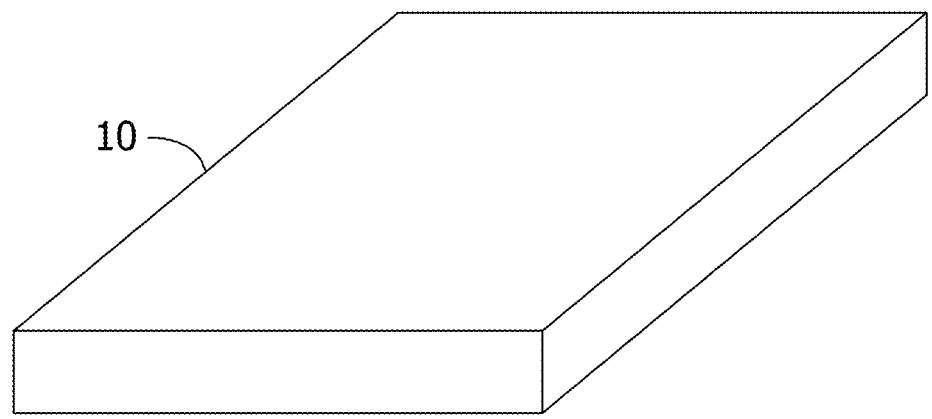
FIG. 1 is a schematic representation of a silicon substrate.
Figure 2:
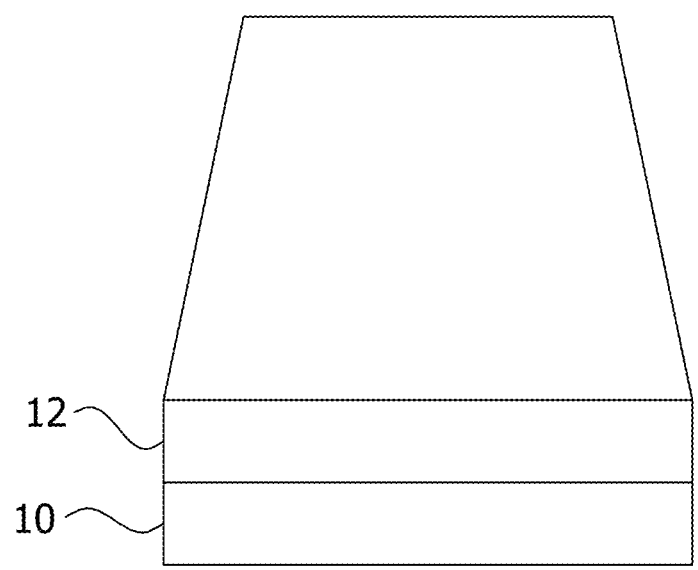
FIG. 2 is a schematic representation of a silicon substrate with a metal-based layer deposited thereon.

In its most basic aspect, the invention involves removing a thin film of metal from an ordered Si-based substrate. In broader context, the invention involves one or more of several steps. A first step in the invention is electrodeposition of metal onto a silicon-based substrate. A silicon based substrate is provided, as shown at 10 in FIG. 1, onto which a thin metal-based layer is deposited, shown at 12 in FIG. 2. One example is pure gold having a highly ordered (111) crystal structure, or other gold-based material. The metal is epitaxially grown on a highly ordered Si (111) substrate. The metal may alternatively be silver, copper, or other metals or alloys. The term "gold-based" herein refers to compositions that are essentially pure gold as well as to compositions containing other elements in addition to gold, even in alloying proportions. The metal film is deposited by methods known in the art and to a thickness on the order of about 5 to about 50 nm, for example, from about 7 to about 30 nm.

Figure 3:
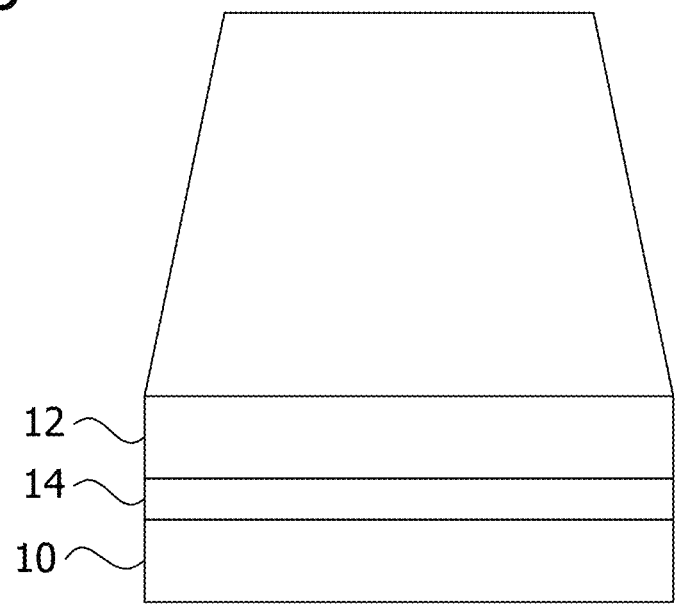
FIG. 3 is a schematic representation of a work piece after an oxidation operation of the the method of the invention.

Since an epitaxially deposited gold-based or other metal film will not readily peel from Si substrate on which it is grown, a subsequent step is to prepare the metal-on-Si deposit for removal of the metal film. In this invention, this is accomplished by oxidation of the Si to SiOx. Since the metal film 12 adheres to Si but not to SiOx, converting the Si at the Si-metal film interface to SiOx allows the metal film to be peeled off to yield a free-standing metal foil. In a preferred embodiment, such as that described in below Example 1 with Au as the metal film, the photochemical oxidation is performed by shining a light onto the metal surface. When the light impacts the metal surface, some of the light penetrates the metal layer because the metal layer is thin and porous. Then when the light that passes through the metal layer 12 impacts the Si substrate 10 under the metal film, it causes photochemical oxidation of the Si to SiOx, with SiOx illustrated as the thin middle layer 14 in FIG. 3. This photochemical oxidation is attributed to the light's generation of electron-hole pairs ($e^-$ and $h^+$ pairs), with the holes driven to the surface where they oxidize Si. In a currently preferred embodiment, this step is performed in an aqueous solution of dilute $H_2SO_4$. This can be performed, for example, with a xenon lamp or a solar simulator. A current embodiment uses a xenon lamp with an irradiance of 100 mW/cm$^2$. This is a broadband, white light, similar to AM1 sunlight. The light energy level is selected to be high enough to excite electrons from the valence band into the conduction band of Si (1.1 eV). In an alternative embodiment described below, the oxidizing the substrate is not performed by photochemical oxidation under application of light; rather, it is performed by pulsing an applied potential which oxidizes Si to SiOx during electrodeposition of Cu.

Figure 4:
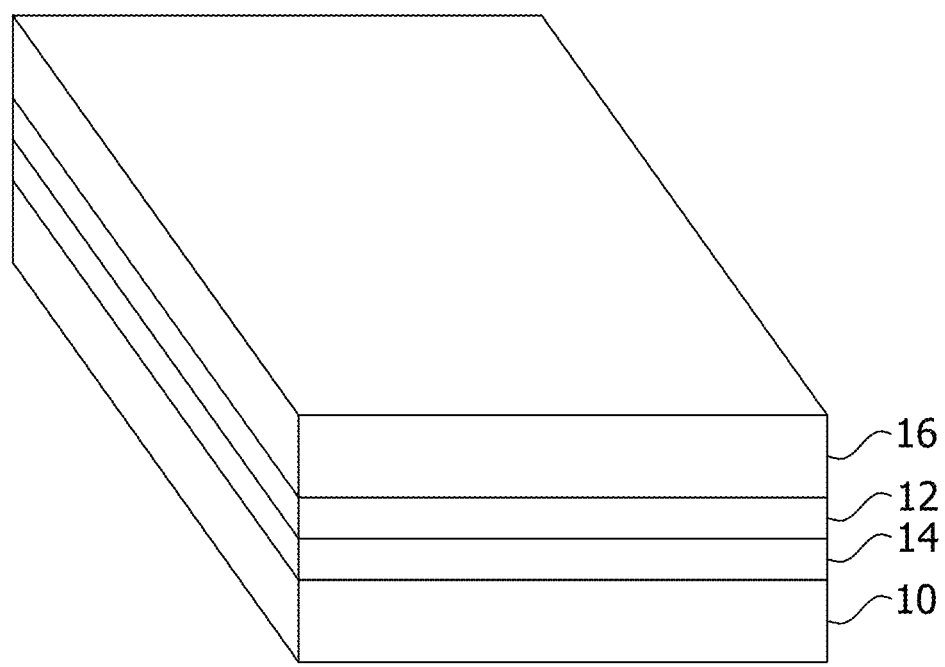
FIG. 4 is a schematic representation of a work piece of FIG. 3 with an adhesive element applied.
Figure 5:
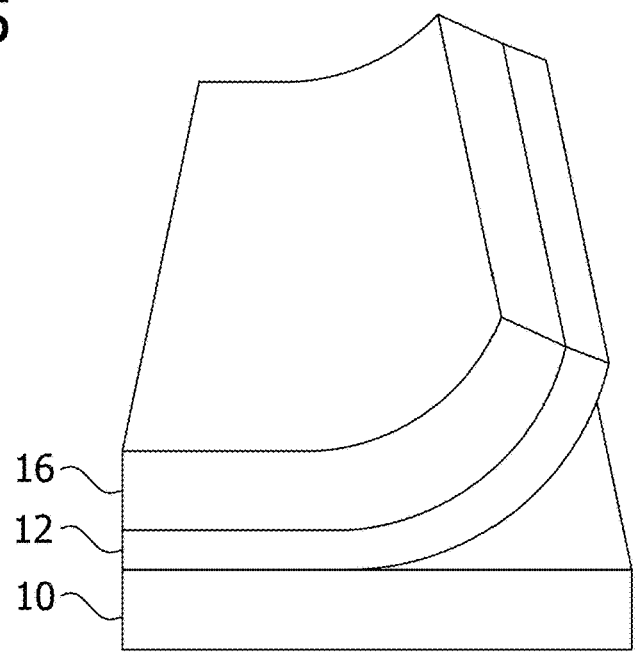
FIG. 5 is a schematic representation of a separation operation of the invention.
Figure 6:
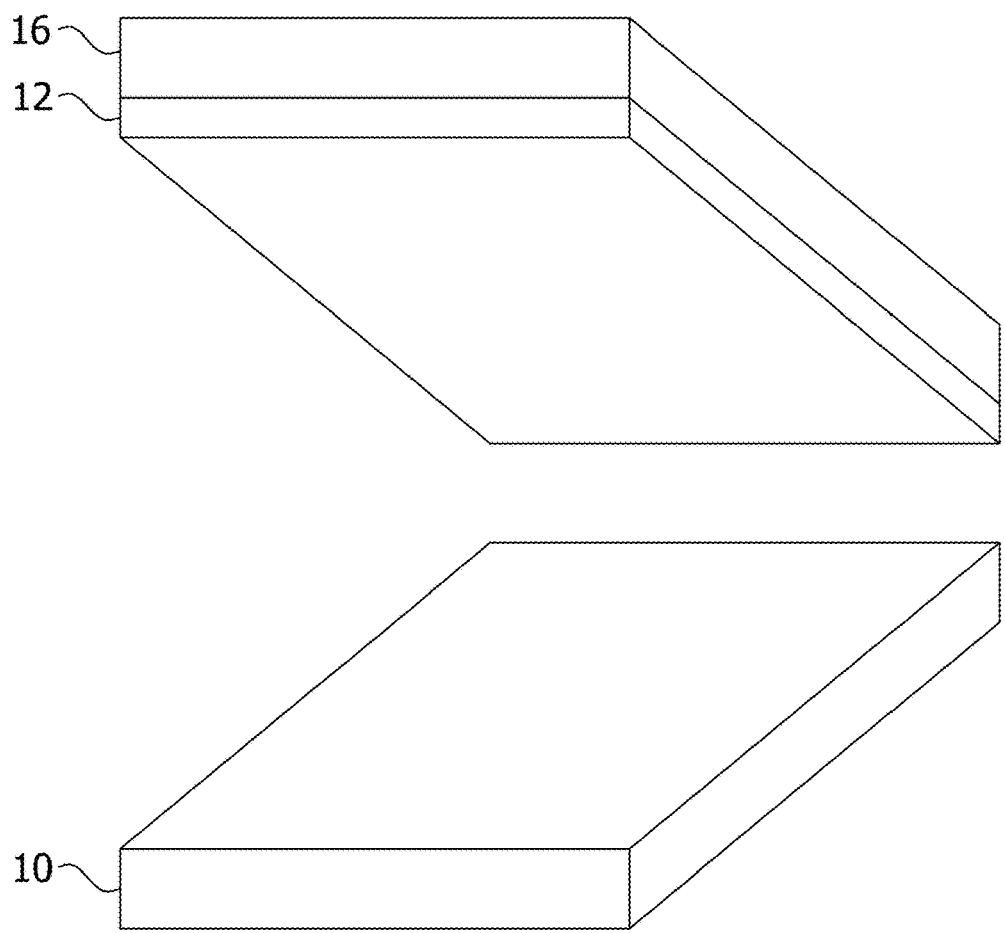
FIG. 6 is a further schematic representation of a separation operation of the invention.

A next step after forming the SiOx layer between the metal film and the Si substrate is to remove the metal film to yield a free-standing metal foil. In one method, an adhesive such as an adhesive tape is applied as shown at 16 in FIG. 4. In the illustrated embodiment, there is an optional HF etch applied to the composite shown in FIG. 4, which removes the SiOx. This aids in separation, and also prepares the Si substrate 10 for reuse. Since the metal foil does not adhere well to the SiOx, the HF etch is not strictly necessary. When Au is the metal, especially, an HF etch is less helpful than perhaps with some other metals, since adhesion between Au and SiOx is so poor anyway. However, with especially thin foils, the further liberation resulting from an HF etch reduces the risk of tearing. The adhesive selected is not attacked by the HF. After applying the adhesive, the composite may be subjected to an HF etch, which removes the SiOx layer, thus freeing the metal foil from the substrate. In particular, the HF etch is applied to the composite shown in FIG. 4, thus removing the SiOx layer 14. The adhesive 16 is then lifted off as shown in FIG. 5, with the SiOx layer 14 having already been etched away. The adhesive layer or tape 16 takes the thin metal layer 12 with it, with complete separation shown in FIG. 6. For thicker metal layers which are thick enough to have their own supporting strength, it is possible to pick them off the substrate without an adhesive, after an HF etch. It is also possible to apply the HF etch prior to application of the adhesive, rather than after application of the adhesive as described above.

Example 1

Wafer-sized transparent and flexible single-crystal foils of gold (Au) were produced by the above-described lift-off procedure using single-crystal Si as the template for electrochemical epitaxial growth. The transparency of these single-crystal Au foils was exploited to fabricate a flexible organic light emitting diode (OLED) based on tris(bipyridyl) ruthenium(II). The single crystal nature of the Au is used to produce an inorganic diode based on epitaxial cuprous oxide ($Cu_2O$) that has more ideal diode characteristics than a diode based on polycrystalline $Cu_2O$.

Epitaxial Au was electrodeposited onto a Si(111) substrate. Previously, we showed that epitaxial electrodeposition of Au on Si(111), Si(100) and Si(110) substrates can serve as a proxy for bulk single-crystal Au. Single-crystal Si(111) with 0.2° miscut toward [112] and a resistivity of 1.15 ohm-cm was used as the substrate to grow the Au foils. The deposition was performed at room temperature in a solution containing 0.1 mM $HAuCl_4$, 1 mM KCl, 1 mM $H_2SO_4$ and 0.1 M $K_2SO_4$ with a Si electrode that was prepolarized at $-1.9$ V versus Ag/AgCl before inserting it in the solution. Prepolarizing the electrode inhibited the formation of an amorphous native oxide layer on the surface of Si and enabled epitaxial growth of Au.

After the epitaxial growth of Au, lateral undergrowth of a SiOx layer was achieved by photoelectrochemically oxidizing the Si under irradiation of light at an applied potential of +0.75 V vs. Ag/AgCl in 0.5 M $H_2SO_4$ solution. Au/n-Si forms a Schottky (rectifying) junction, so irradiation of light is required to generate holes at the Au/n-Si interface to oxidize the Si. The epitaxy of the Au foil was maintained during the lateral undergrowth of SiOx, analogous to the epitaxial lateral overgrowth process in silicon-on-insulator technology. A polymer adhesive tape was then applied to the surface of Au as a support and facilitator for foil separation. Hot glue is an alternative option. The SiOx layer was etched using dilute (5%) hydrofluoric acid (HF) to aid detachment of the Au foil from the Si substrate and enabled an effortless separation of the foil. Both the tape and hot glue have high optical transmittance in the visible range (400 to 800 nm) and are resistant to chemical etching procedures. After the foil separation, the Si substrate was etched using a KI and $I_2$ solution to dissolve any residual Au, and the Si substrate then reused. Because only a 2-3 nm thick layer of SiOx is removed during each fabrication cycle without extensive roughening, the Si is reusable potentially for up to thousands of times.

Example 2

Figure 7:
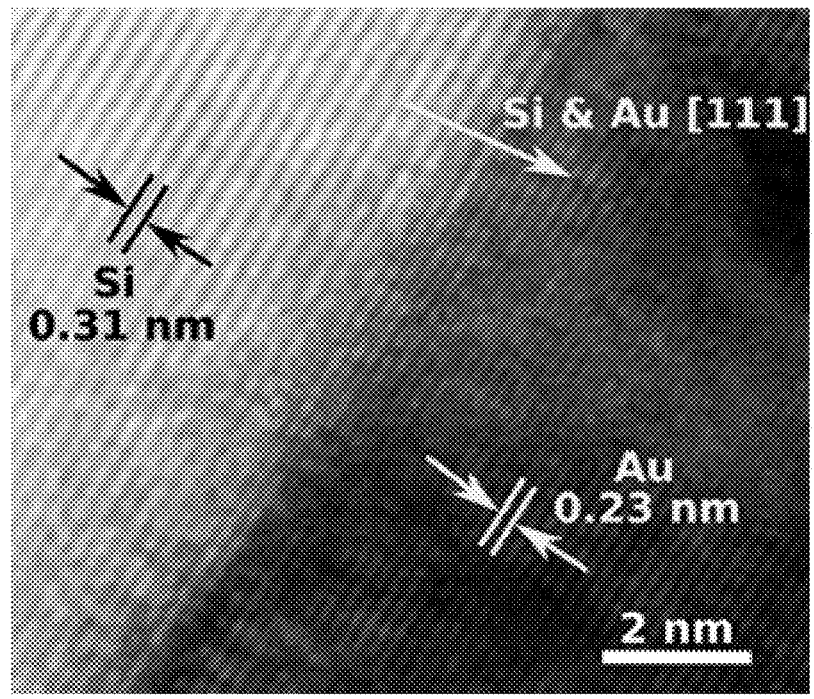
FIG. 7 is a photomicrograph by high-resolution transmission electron microscopy (HRTEM) showing interfacial changes during photoelectrochemical oxidation of Si.
Figure 8:
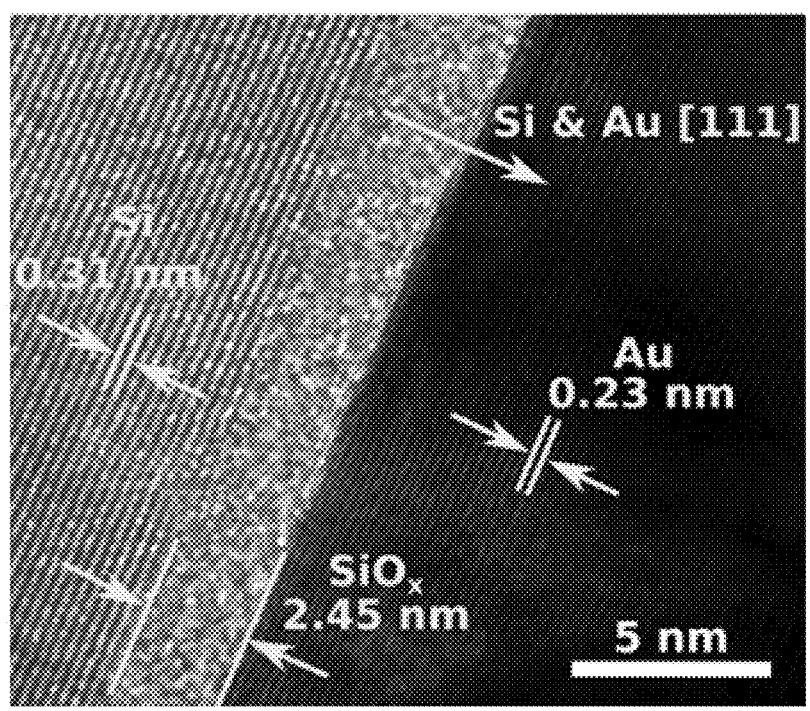
FIG. 8 is a photomicrograph showing photoelectrochemical oxidation of Si and an amorphous SiOx interface on a work piece processed according to the invention.

High-resolution transmission electron microscopy (HR-TEM) was used to study the interfacial changes during photoelectrochemical oxidation of Si. The as-deposited film did not show an interfacial SiOx layer between the Si(111) and Au(111), as seen by the abrupt transition at the interface in the image of FIG. 7. Electron diffraction (ED) patterns for the as-deposited layers of Au on Si showed a spot pattern with in-plane and out-of-plane order. After the photoelectrochemical oxidation of Si, an amorphous SiOx interface with a thickness of 2.45 nm was evident, as illustrated in FIG. 8. Native oxide formation on the Si surface in ambient air is limited to 0.5 to 1 nm because of the dense pin-hole free oxide layer that protects the Si from further oxidation. However, during photoelectrochemical oxidation of Si, tunneling of electrons through the insulating oxide layer caused the SiOx layer to grow thicker. The tunneling of electrons completely shuts off when the oxide layer reaches a thickness of 2.0 to 2.5 nm and the photocurrent dropped nearly to zero. The ED pattern of Au on Si with an interfacial oxide layer also showed a similar spot pattern, indicating that the epitaxy was maintained after the lateral undergrowth of SiOx. Both micrograph images of FIGS. 7 and 8 are viewed along the [112] zone axis, and the measured d-spacing for Au and Si are consistent with bulk values.

Example 3

Figure 9:
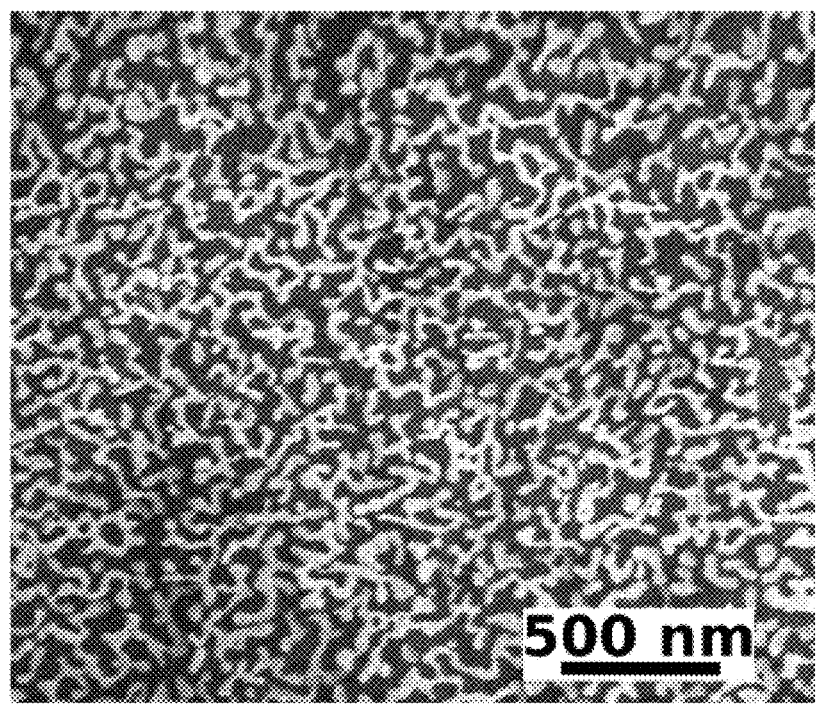
FIG. 9 shows a Au foil formed in accordance with the invention.
Figure 10:
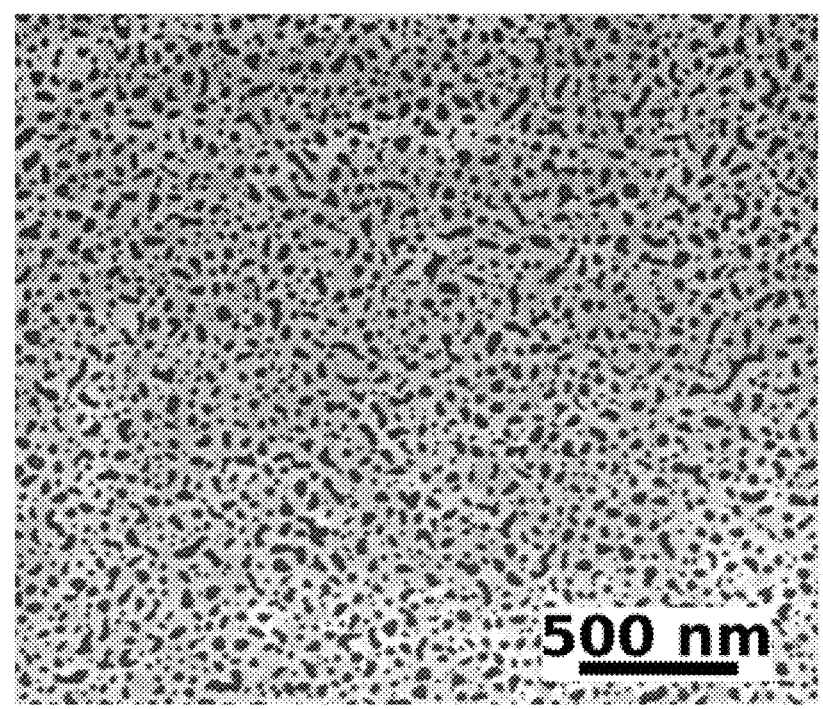
FIG. 10 shows a Au foil formed in accordance with the invention.
Figure 11:
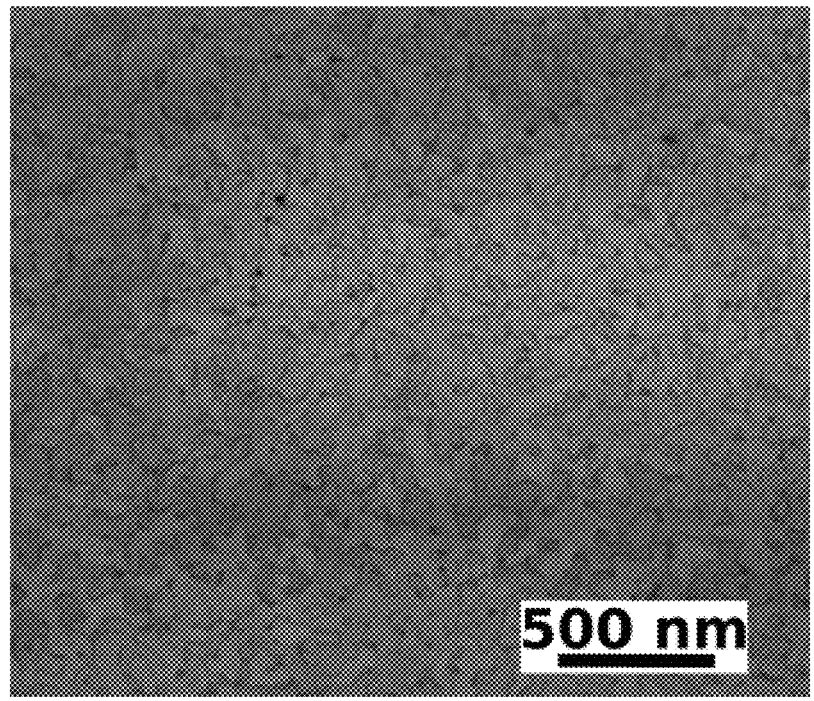
FIG. 11 shows a Au foil formed in accordance with the invention.
Figure 12:
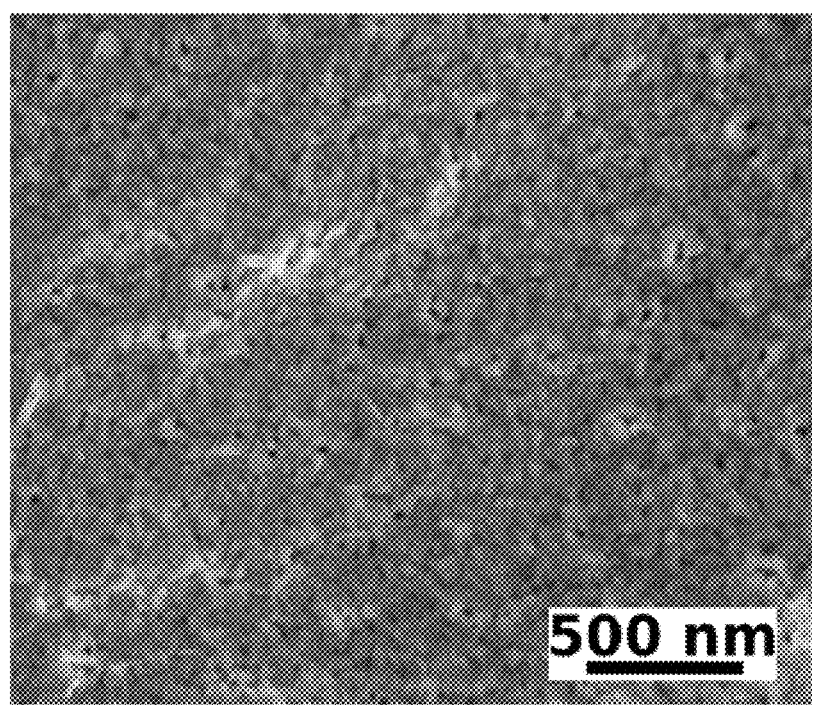
FIG. 12 shows a Au foil formed in accordance with the invention.

Scanning electron microscopy (SEM) was performed to study the surface morphology and the initial nucleation and growth of Au foils. All of the foils for SEM were separated with an adhesive tape as the support layer. FIG. 9 shows a Au foil formed after 5 minutes with a fractal morphology that had been reported for evaporated ultrathin films of Au. We attribute these fractal features to the diffusion-limited aggregation of Au on the surface of Si during the initial nucleation period. This Au foil has a coverage of 56% and appears to be at the percolation threshold thickness (5 to 6 nm). Beyond the percolation threshold, the fractal features are interconnected in a large network mesh with electrical connectivity across the entire foil. FIG. 10 shows Au foils deposited for 10 minutes with 70% coverage; and FIGS. 11 and 12 show Au foils deposited for 20 and 30 minutes, respectively.

Example 4

Figure 13:
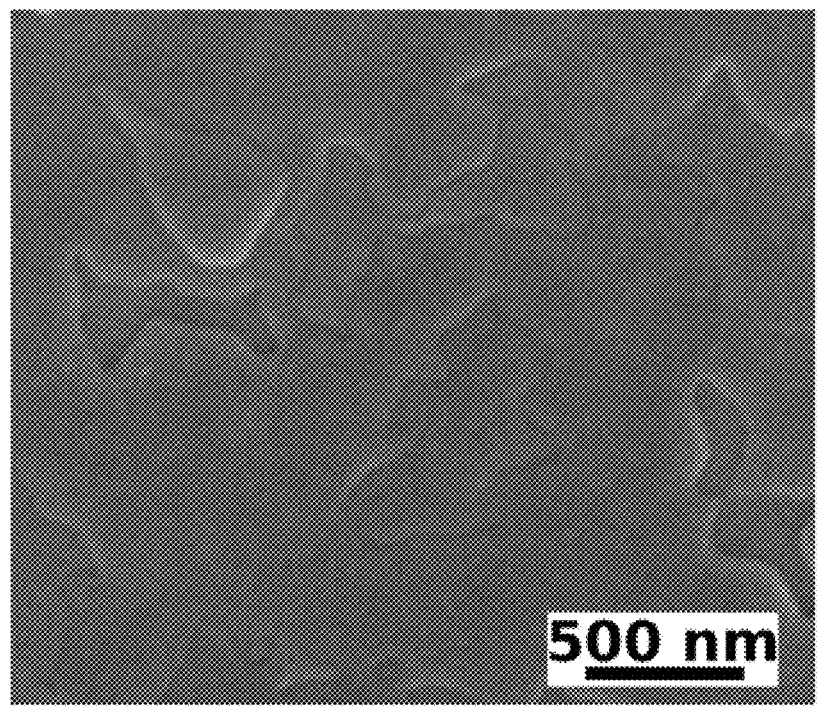
FIG. 13 shows $Cu_2O$ electrodeposited on a Au foil for use to study the diode characteristics.
Figure 14:
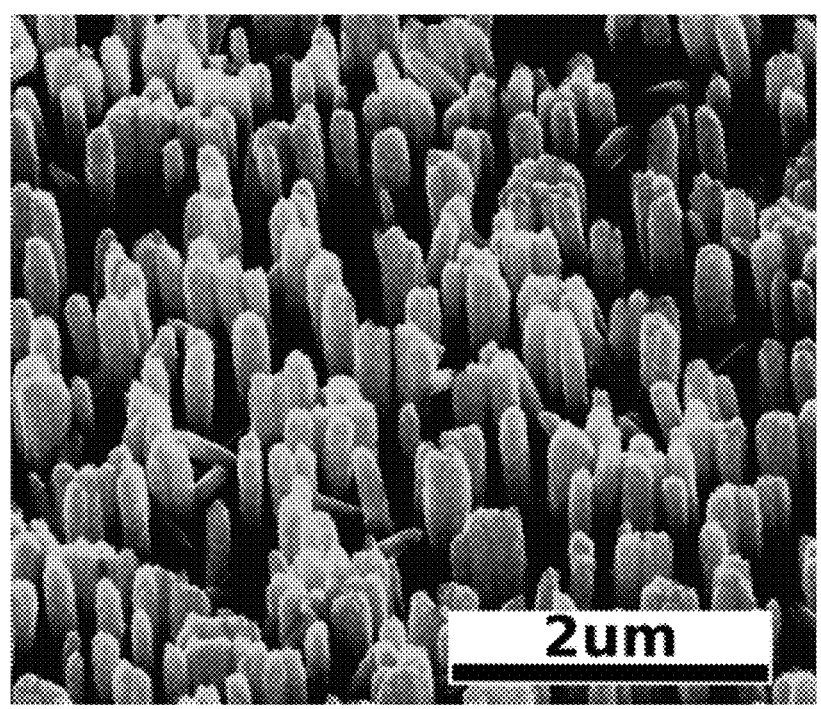
FIG. 14 shows zinc oxide (ZnO) nanowires electrodeposited on a Au foil.

The applicability of Au foils as a substrate was tested by depositing and characterizing inorganic semiconductor thin film and nanowires. FIG. 13 shows $Cu_2O$ that was electrodeposited on a 30-minute Au foil for use to study the diode characteristics. FIG. 14 shows zinc oxide (ZnO) nanowires electrodeposited on a 10-minute Au foil. This was subjected to 500 bending cycles with the radius of curvature of 3 mm. The ZnO remained intact after the bending cycles, which can be attributed to its nanowire morphology and the flexibility of Au foil. Although the 5-minute and 10-minute Au foils appear porous, foils beyond the percolation threshold thickness (5-6 nm) enable electrical contact over the entire sample area and make electrodeposition feasible.

Example 5

Epitaxial Au on Si and free-standing Au foils produced according to the invention were evaluated using x-rays to study the out-of-plane and in-plane orientations. X-ray diffraction (XRD) pattern of a 30-minute Au on Si deposit revealed that Au follows the out-of-plane orientation of Si. The Au XRD pattern follows the [111] orientation of Si indicating a high out-of-plane order. Films of $Cu_2O$ and ZnO deposited on the Au foil of the invention were also studied. Both the Au foil and the electrodeposited $Cu_2O$ had a strong [111] out-of-plane orientation. The ZnO film also grew epitaxially on Au foil, but showed a strong [0001] out-of-plane orientation because of its hexagonal crystal structure.

Example 6

High optical transmittance and low sheet resistance are imperative for Au foils to be used as flexible and transparent substrates. The sheet resistance for all of the foils (measured with a four-point probe) increased along with transmittance as the Au foil thickness decreased. A 7-nm-thick Au foil showed the highest transmittance of 85%, and the 28-nm-thick foil showed the lowest at 25%. The endurance of the Au foils as a function of sheet resistance was measured by subjecting the foils up to 4000 bending cycles. Bending cycles for all of the foils were performed with a steel rod as a guide with a radius of curvature of 3 mm. The sheet resistance of 28, 16, and 11 nm thick Au foils increased by 4%, 6.3%, and 34%, respectively, after 4000 cycles of bending.

Example 7

Films of Cu (100) were electrolytically deposited and lifted off producing freestanding single-crystal-like Cu (100) foils. The Cu was deposited from a pH 3 electrolyte containing 2 mM $CuSO_4$, 0.1 M $K_2SO_4$, and 1 mM $H_2SO_4$. The solution was kept at room temperature during deposition and stirred at 250 RPM with a magnetic stir bar. The n-Si(100) substrate was prepared by first cleaning the wafer via the RCA standard method, breaking the wafer into roughly 1 $cm^2$ pieces, applying GaIn eutectic to form an ohmic back contact, attaching a silver wire with conductive silver paint, and then electrically isolating the back contact with etch resist wax. Before deposition, the n-Si(100) electrode was etched in 5% HF for 20 seconds to give an H—Si surface. The electrodeposition itself was accomplished by a two-step operation involving a) pre-polarization followed by b) bulk deposition. In particular, the electrode was pre-polarized at $-1.5\ V_{Ag/AgCl}$ and plunged into the electrolyte for 2 seconds, after which the potential was raised to a more positive potential of $-0.5\ V_{Ag/AgCl}$ and held until the desired thickness of Cu was achieved. The pre-polarization step serves to form nucleation sites for Cu deposition. This is performed at a potential which is negative of the potential at which Si oxidizes to SiOx. A three electrode setup having a platinum wire counter electrode and a $Ag/AgCl/KCl_{sat}$ reference electrode was utilized. During continued deposition and growth of the Cu layer, an SiOx layer formed at the top of the Si substrate, between the Cu being deposited and the Si. The pre-polarization step for initial nucleation is therefore critical to applicant's method, because without this step, the formation of an SiOx layer prior to or simultaneously with nucleation would inhibit the epitaxial deposition of Cu. The pre-polarization in one embodiment is for between about 1 and about 5 seconds and is at a potential of less than about $-1.0$ V, which potential is lower than the potential for the subsequent bulk deposition, which is between $-1.0$ and $0$ V. In this embodiment of the invention, therefore, the oxidation of Si is accomplished by application of Si-oxidizing potential to the substrate during the deposition of the metal layer, in particular, the Cu layer, but only after application of an initial non-Si-oxidizing potential for nucleation of Cu growth. During the bulk film growth, the Si oxidizes to SiOx because the potential is poised positive of the potential at which Si oxidizes to SiOx. The O for the SiOx comes from the solution. It is therefore necessary that the solution contacts some exposed Si. During the bulk film growth, both oxidation of Si and growth of Cu are occurring, but the epitaxial nucleation sites ensure that the final film is epitaxial.

After deposition, the composite was subjected to an etching operation, such as etching in 5% HF. This etched away the SiOx layer that forms during Cu growth. The film was then removed by peeling the adhesive substrate, with the Cu foil, off of the Si. This deposition and recovery method may be used for other metals such Ag, Co, Ni, and others.

Single-crystal-like Cu foils can be useful as a highly ordered flexible substrate in much the same way as the rolling assisted biaxially textured substrates (RABiTS). The vast research on RABiTS in applying buffer layers, depositing high temperature superconductors, and use in photovoltaics should be directly applicable to these single-crystal-like Cu foils.

It can therefore be appreciated that a simple epitaxial lift-off procedure is described that produces single-crystal foils that offer the order of traditional semiconductors such as Si wafers without the constraint of a rigid substrate. The foils are flexible and optically transparent, and show promise for producing flexible and wearable displays, solar cells, and sensors. The epitaxial growth of $Cu_2O$ and ZnO that was demonstrated and can be applied to a wide range of inorganic semiconductors such as CdSe, CdTe, and ZnSe for use in flexible solar cells. Because ZnO is both a wide-bandgap semiconductor and a piezoelectric material, it should be possible to produce pressure-sensitive, electronic skin and LEDs based on the ZnO/Au system. Also, Au is hypoallergenic and could serve as the platform for wearable sweat sensors for continuous health monitoring. Although the emphasis of this work was to produce ordered substrates for flexible electronics, the processing method can be used to provide an inexpensive source of large metallic single crystals. These could serve as ordered substrates for photovoltaics, high temperature superconductors, stress-free microelectromechanical systems (MEMS), catalysts, underpotential deposition, self-assembled monolayers, and molecular electronics. These could also be used in making jewelry.

In view of the above, it will be seen that the several objects of the invention are achieved and other advantageous results attained.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above compositions and methods without departing from the scope of the invention, it is intended that all matter contained in the above description and shown in the accompanying drawings shall be interpreted as illustrative and not in a limiting sense.

The invention claimed is:

1. A method for producing a metal foil comprising:
depositing metal onto an oxidizable substrate comprising single crystal Si to form a metal film on the substrate;
oxidizing the substrate at an interface between the metal film and the substrate; and
removing the metal film from the substrate to yield a metal foil.

2. The method of claim 1 wherein the substrate is single-crystal Si (111) and the metal film is single-crystal Au (111).

3. The method of claim 2 wherein the oxidizing comprises directing light energy through the metal film to impact the substrate at the interface.

4. The method of claim 2 wherein the oxidizing comprises submerging the metal film and substrate in an acidic solution and directing light energy through the metal film to impact the substrate at the interface while the metal film and substrate are submerged in the solution.

5. The method of claim 2 wherein said depositing said metal comprises:
pre-polarizing the single-crystal Si by application of a potential which is negative of a potential at which Si oxidizes, which pre-polarization occurs in the presence of metal ions to form metal growth nucleation sites on the substrate, followed by
application of a potential at which both oxidation of Si and electrodeposition of the metal occur to grow the metal film and perform said oxidizing of the Si to SiOx, which potential is more positive than the potential applied in the pre-polarization step.

6. The method of claim 1 wherein the substrate is single-crystal Si (100) and the metal film is single-crystal Cu (100).

7. The method of claim 6 wherein the oxidizing comprises directing light energy through the metal film to impact the substrate at the interface.

8. The method of claim 6 wherein the oxidizing comprises submerging the metal film and substrate in an acidic solution and directing light energy through the metal film to impact the substrate at the interface while the metal film and substrate are submerged in the solution.

9. The method of claim 6 wherein said depositing said metal comprises:
pre-polarizing the single-crystal Si by application of a potential which is negative of a potential at which Si oxidizes, which pre-polarization occurs in the presence of metal ions to form metal growth nucleation sites on the substrate, followed by
application of a potential at which both oxidation of Si and electrodeposition of the metal occur to grow the metal film and perform said oxidizing of the Si to SiOx, which potential is more positive than the potential applied in the pre-polarization step.

10. The method of claim 1 comprising:
said depositing said metal wherein the substrate is single-crystal silicon and the metal film is single-crystal Au having a thickness between about 5 and about 50 nm;
said oxidizing the substrate is performed by directing light energy through the metal film to impact the substrate at the interface while the metal film and substrate are submerged in an acidic solution; and
the removing the metal film from the substrate is performed by attaching an adhesive element to the metal film and pulling the adhesive element away from the substrate to separate the adhesive element and metal film from the substrate.

11. The method of claim 10 wherein said depositing said metal comprises:
pre-polarizing the single-crystal Si by application of a potential which is negative of a potential at which Si oxidizes, which pre-polarization occurs in the presence of metal ions to form metal growth nucleation sites on the substrate, followed by
application of a potential at which both oxidation of Si and electrodeposition of the metal occur to grow the metal film and perform said oxidizing of the Si to SiOx, which potential is more positive than the potential applied in the pre-polarization step.

12. The method of claim 1 wherein:
said substrate is single-crystal Si and the metal film has a thickness of at least about 5 nm;
said oxidizing the substrate is performed by application of a potential which oxidizes Si to SiOx during electrodeposition of the metal; and
the removing the metal film from the substrate is performed by attaching an adhesive element to the metal film and pulling the adhesive element away from the substrate to separate the adhesive element and metal film from the substrate.

13. The method of claim 12 wherein the metal is Cu and the metal film is single crystal Cu.

14. The method of claim 1 wherein said depositing said metal comprises:

pre-polarizing the single-crystal Si by application of a potential which is negative of a potential at which Si oxidizes, which pre-polarization occurs in the presence of metal ions to form metal growth nucleation sites on the substrate, followed by application of a potential at which both oxidation of Si and electrodeposition of the metal occur to grow the metal film and perform said oxidizing of the Si to SiOx, which potential is more positive than the potential applied in the pre-polarization step.

15. The method of claim 14 wherein the metal is Cu.

16. The method of claim 1 wherein the metal is Au, Ag, Cu, Au-based, Ag-based, or Cu-based.

17. The method of claim 1 wherein the metal film has a thickness between about 5 and about 50 nm.

18. The method of claim 1 wherein the oxidizing comprises directing light energy through the metal film to impact the substrate at the interface.

19. The method of claim 1 wherein the oxidizing comprises submerging the metal film and substrate in an acidic solution and directing light energy through the metal film to impact the substrate at the interface while the metal film and substrate are submerged in the solution.

20. The method of claim 1 further comprising exposing the metal film and substrate to a hydrofluoric acid solution prior to removing the metal film from the substrate.

* * * * *